United States Patent [19]
Kutter et al.

[11] Patent Number: 5,943,255
[45] Date of Patent: Aug. 24, 1999

[54] READ ONLY MEMORY

[75] Inventors: Christoph Kutter, München; Georg Tempel, Zorneding, both of Germany

[73] Assignee: Siemens Aktiengesellschaft, Munich, Germany

[21] Appl. No.: 09/049,558

[22] Filed: Mar. 27, 1998

[30] Foreign Application Priority Data

Mar. 27, 1997 [DE] Germany ............................ 197 13 173

[51] Int. Cl.⁶ ........................... G11C 17/00; G11C 11/50; G11C 11/34
[52] U.S. Cl. ............................ 365/94; 365/164; 365/174; 438/619
[58] Field of Search ........................... 365/94, 164, 174; 438/619

[56] References Cited

U.S. PATENT DOCUMENTS

| | | | |
|---|---|---|---|
| 4,233,671 | 11/1980 | Gerzberg et al. | 365/105 |
| 4,561,173 | 12/1985 | Te Velde | 438/619 |
| 5,774,414 | 6/1998 | Melzner et al. | 365/174 |

FOREIGN PATENT DOCUMENTS

4205044C2  7/1996  Germany.

OTHER PUBLICATIONS

IBM Technical Disclosure Bulletin, vol. 27, No. 7A, Dec. 1984, pp. 3874–3875.

Primary Examiner—Trong Phan
Attorney, Agent, or Firm—Herbert L. Lerner; Laurence A. Greenberg

[57] ABSTRACT

The read only memory has a plurality of conductor track planes one above the other. The conductor tracks in adjacent planes are oriented such that they intersect in intersecting regions. In these intersecting regions, either a VIA tunnel contact is provided, which represents a logic "1" or no VIA tunnel contact is provided, so that this intersecting region represents a logic "0". In this way, over the same surface area, a plurality of memory cells can be produced one above the other. The read only memory is produced with a defined sequence of process steps and it is operated by selectively applying predetermined voltages across the various conductor tracks.

13 Claims, 2 Drawing Sheets

READ ONLY MEMORY

BACKGROUND OF THE INVENTION

1. Field of the Invention

The invention relates to a read only memory (ROM), a method for producing a read only memory, and a method for operating a read only memory in which a selected cell of the read only memory is read out.

Read only memories (ROM), which contain a fixed, predetermined body of information, are very widely used in computers, printers, and all types of electronic devices. Read only memories are predominantly produced by MOS technology. As a rule, the items of information are reproduced by the disposition or omission of a single transistor. The usual memory concepts are based on the LOCOS ROM; the depletion ROM, in which a distinction is made between a NAND ROM and a NOR ROM; the contact hole ROM; and a number of other types, all described in "Semiconductor Memories" by B. Prince, John Wiley & Sons, B. G. Teubner, Stuttgart (2d ed.). A common feature of those memory concepts is that they are constructed in planar fashion on the silicon substrate. Based on the smallest feasible structure width, also known as feature size f, the smallest possible cell accordingly requires a surface area of $4f^2$.

SUMMARY OF THE INVENTION

It is accordingly an object of the invention to provide a read only memory, which overcomes the above-mentioned disadvantages of the prior art devices and methods of this general type and which enables an especially high storage density and is especially simple in structural design. It is a further object of the invention to provide a method for producing such a read only memory. Finally, it is again a further object of the invention to provide for a method of operating such a read only memory.

With the foregoing and other objects in view there is provided, in accordance with the invention, a read only memory, comprising:

a multiplicity of conductor tracks respectively disposed in a plurality of conductor track planes including a first conductor track plane and at least one adjacent conductor track plane;

the conductor tracks of the first conductor track plane intersecting the conductor tracks of the at least one adjacent conductor track plane at intersecting regions; and electrical contacts formed at selected intersecting regions between the conductor tracks of the first conductor track plane and of the at least one adjacent conductor track plane for representing a given logic state at the selected intersecting regions.

The objects of the invention are satisfied, with the features of the invention in that the read only memory has conductor tracks in conductor track planes; that the conductor tracks of one conductor track plane intersect the conductor tracks of an adjacent conductor track plane in intersecting regions. In the intersecting regions—representing defined logic states—there is provided either an electrical contact or no electrical contact between the intersecting conductor tracks of adjacent conductor track planes. The memory cell thus produced, similarly to prior art read only memory cells, has a cell size of $4f^2$. By using a plurality of planes, a plurality of memory cells can be constructed one above the other. If conductor tracks are disposed in three planes, then between them two cells can be constructed one above the other, so that the effective cell area is $(4/2)f^2$. Where there are four conductor track planes, three cell planes are possible, making the effective cell area then $(4/3)f^2$. Correspondingly, five conductor track planes leads to a effective cell area of $f^2$. It is therefore preferable for at least three conductor track planes to be provided by the embodiment according to the invention, substantially higher storage densities than in the previously known read only memories can be attained.

In accordance with an added feature of the invention, the conductor tracks are metal tracks. This has the advantage that it is possible to profit from technological experience in the field of multilayer metallizing.

The conductor tracks have preferably aluminum, or an aluminum-copper alloy. In another preferred embodiment, the conductor tracks are constructed of polysilicon. This has the advantage that various preliminary process steps, such as the production of a tunnel oxide, can be done thermally or by a rapid thermal annealing process. In particular, a combination of conductor tracks of metal and conductor tracks of polysilicon can be favorable; the alternating layering of one plane having conductor tracks of metal and one plane having conductor tracks of polysilicon is especially preferable.

The electrical contacts are favorably embodied as contact holes with a tunnel contact, also known as a VIA tunnel contact. Such an embodiment of the electrical contacts makes a simple method for reading out the memory cells possible. It is preferable that the VIA tunnel contacts have a tunnel oxide on the lower conductor track plane and a VIA plug. The VIA plug preferably comprises tungsten or aluminum.

The conductor tracks preferably intersect at an angle of 90°. For certain applications, other orientations of the conductor tracks are also conceivable, but any angle other than 90° demands a greater surface area. An intermetal oxide is favorably disposed between the conductor tracks and the conductor track planes. Here TEOS oxide (tetraethyl orthosilicate) is preferably used.

With the above and other objects in view there is also provided, in accordance with the invention, a method of producing a novel read only memory. The method comprises the following steps:

depositing a metal layer on a substrate; structuring the metal layer into conductor tracks with a phototechnique; correspondingly etching the metal layer; depositing an interpolydielectric on the conductor tracks; smoothing a surface of the interpolydielectric with a CMP process; forming contact holes with a phototechnique and ensuing etching; creating a tunnel oxide in the contact holes on the conductor tracks; filling the contact holes with a VIA plug; depositing and structuring a further metal layer to form metal conductor tracks which extend transversely to and intersect the first, above-mentioned conductor tracks; and repeating the various steps following the formation of conductor tracks at least once.

In other words, a metal layer is first deposited; a phototechnique is performed for structuring the metal layer in conductor tracks and the metal layer is correspondingly etched; an interpolydielectric is deposited, which is chemically-mechanically polished to obtain a smooth planar surface; a phototechnique and ensuing etching are performed to create contact holes; a tunnel oxide is created in the contact holes on the conductor tracks; the contact holes are filled with a VIA plug; a further metal layer is deposited and structured; and so on. In conclusion, an uppermost metal layer is deposited and structured. The result is a read only memory with metal conductor tracks. In this method, the knowledge and experience gained in the field of multilayer metallizing can be employed. This is true particularly for the CMP process, which has made it possible to produce virtually planar surfaces, which in turn makes it possible to deposit a plurality of metal planes one above the other. The actual information stored in the read only memory is contained in the phototechnique for VIA etching. This etching defines which of the intersecting regions will contain an electrical contact and which will not. One electrical contact can then stand for the logical information 1, and no electrical contact can stand for the logical information 0.

In accordance with a further feature of the invention, the tunnel oxide is formed by CVD (chemical vapor deposition). Care should then be taken that the tunnel oxide is deposited with high quality and uniformly.

In a further method of producing a read only memory, the following steps are performed: depositing a polysilicon layer; structuring the polysilicon layer with a phototechnique into conductor tracks; correspondingly etching the polysilicon layer; depositing an interpolydielectric on the structured and etched polysilicon layer; smoothing a surface of the interpolydielectric with a CMP process; forming contact holes with a phototechnique and ensuing etching; forming a tunnel oxide in the contact holes on the conductor tracks; filling the contact holes with a VIA plug; depositing and structuring a further polysilicon layer to form conductor tracks extending transversely to and intersecting the conductor tracks formed in the above step. After the steps following the production of the conductor tracks have been repeated at least once, a metal layer is deposited and structured in conclusion.

In the etching to produce the contact holes, a good etching stop on the underlying polysilicon must be attained, with an especially smooth surface of the polysilicon. The tunnel oxide is preferably produced by thermal oxidation. In another embodiment, RTP (rapid thermal processing) is performed for producing the tunnel oxide.

In accordance with yet another feature of the invention, the interpolydielectric is TEOS.

In a particularly advantageous feature of the invention, the two proposed methods are combined with one another, so that the entire multilayer VIA tunnel read only memory has both metal tracks and polysilicon tracks.

With the above and other objects in view there is also provided, in accordance with the invention, a method of operating the above-described read only memory by reading out a given memory cell. The method comprises:

selecting a given memory cell of the read only memory;

applying a first voltage to one conductor track of the selected cell;

applying a second voltage to the other conductor track of the selected cell;

applying a third voltage to all remaining conductor tracks; and setting the first voltage lower than the third voltage, and the third voltage lower than the second voltage.

The result is that the voltage difference between the second voltage and the first voltage (V3−V1) drops at the tunnel oxide of the selected cell, whereby the voltage has to be high enough to generate a readable current.

The third voltage is preferably 0V, the first voltage is −2V, and the second voltage is +2V.

Other features which are considered as characteristic for the invention are set forth in the appended claims.

Although the invention is illustrated and described herein as embodied in read only memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
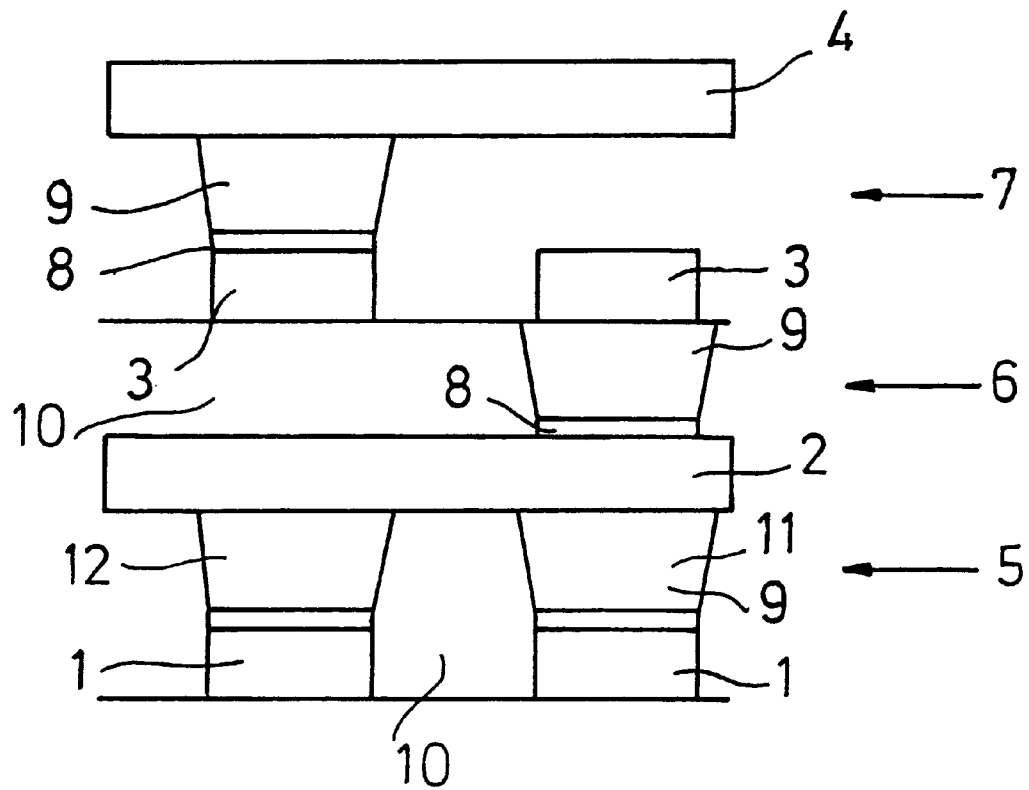
FIG. 1 is a schematic sectional view taken through a portion of a read only memory according to the invention.

Referring now to the figures of the drawing in detail and first, particularly, to FIG. 1 thereof, there is seen a multilayer VIA tunnel read only memory with four conductor track planes illustrated. By means of the conductor track planes 1, 2, 3 and 4, three storage planes 5, 6, 7 are made, each disposed between the respective conductor track planes. The conductor tracks in the lowermost conductor track plane 1 extend perpendicularly to the plane of the drawing, while the conductor tracks of the conductor track plane 2 above it extend parallel to the plane of the drawing. The conductor tracks of the adjacent planes intersect at an angle of 90°. The section shown here extends through an intersecting region and in these intersecting regions contact holes 11, 12 have either been made, or not. Thus two contact holes 11, 12 are provided in the cell plane 5, which is located between the conductor track planes 1 and 2. By comparison, there is only one contact hole in the cell planes 6 and 7. In the contact holes, a tunnel oxide is applied over the lower conductor track, and the remaining space is filled up to the overlying conductor track plane with a VIA plug 9. The VIA plugs 9 are formed of tungsten or aluminum or an alloy thereof. Copper can also be used here.

The production is as follows: a first metal layer is first deposited and structured, with the aid of a phototechnique and an ensuing etching process, in such a way that conductor tracks 1 are created. After that, an intermetal oxide 10 is deposited, preferably using TEOS. The intermetal oxide 10 fills up the spaces between the conductor tracks 1 of the lowermost metal layer and forms a uniform layer above the lowermost conductor tracks. With the aid of a chemical mechanical polishing process (CMP), the surface of the intermetal oxide 10 is planarized. As a result, it is possible to apply other sequences of layers over that. First, however, the contact hole or VIA etching is prepared for, using a further phototechnique. The mask used in this phototechnique contains the actual items of information that are stored in the read only memory. In the lowermost cell plane 5 shown in FIG. 1, two contact holes 11, 12 are created, each of which represents one logical state. In the cell plane 6 lying over that, a contact hole is produced only on the right-hand side, while in the uppermost cell plane 7 a contact hole is produced only on the left-hand side. In the production process of the lowermost cell plane 5, after the etching of the contact holes, a tunnel oxide 8 is deposited in the contact holes 11, 12 by chemical vapor deposition. Care must be taken to assure good process conditions, since a high quality and uniform thickness of the tunnel oxide are of major significance for the functional reliability of the memory. After the deposition of the tunnel oxide 8, the contact holes 11, 12 are then filled up with a VIA plug 9. Aluminum and tungsten are preferably used for this purpose. Over that, the next metal plane is deposited, from which once again, by a phototechnique, conductor tracks in a conductor track plane 2 are formed. Those conductor tracks preferably extend at an angle of 90° from the conductor tracks of the conductor track plane 1. The method steps employed in producing the cell plane 5 are repeated for producing the next cell planes.

Instead of metal conductor tracks, it is also possible to use polysilicon conductor tracks. The production method differs to the extent that in the VIA etching, care must be taken to provide a good etch stop on the lowermost polysilicon layer, so as to have the most planar possible application the application of the tunnel oxide. The tunnel oxide can then be produced by thermal oxidation or rapid thermal processing.

Figure 2:
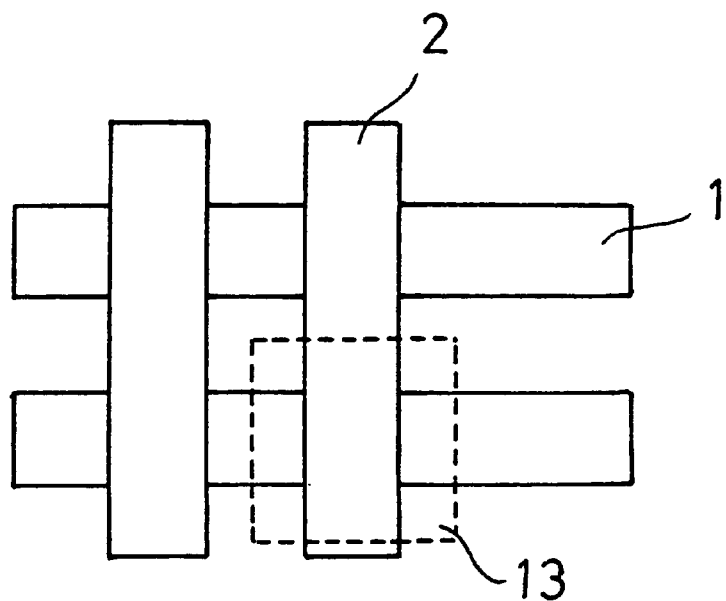
FIG. 2 is a plan view on a portion of a read only memory according to the invention.

Referring now to FIG. 2, there is shown a plan view onto a portion of a read only memory according to the invention. The lower conductor tracks 1 extend perpendicularly to the conductor tracks 2 lying above them. The conductor tracks are produced by a phototechnique and therefore have the least possible width, namely the feature size f. In the intersecting regions of the conductor tracks 1 and 2 lying one above the other, the electrical contacts are made. A cell 13 is indicated in dashed lines, whose dimensions are 2f·2f, resulting in a surface area of 4f$^2$.

Figure 3:
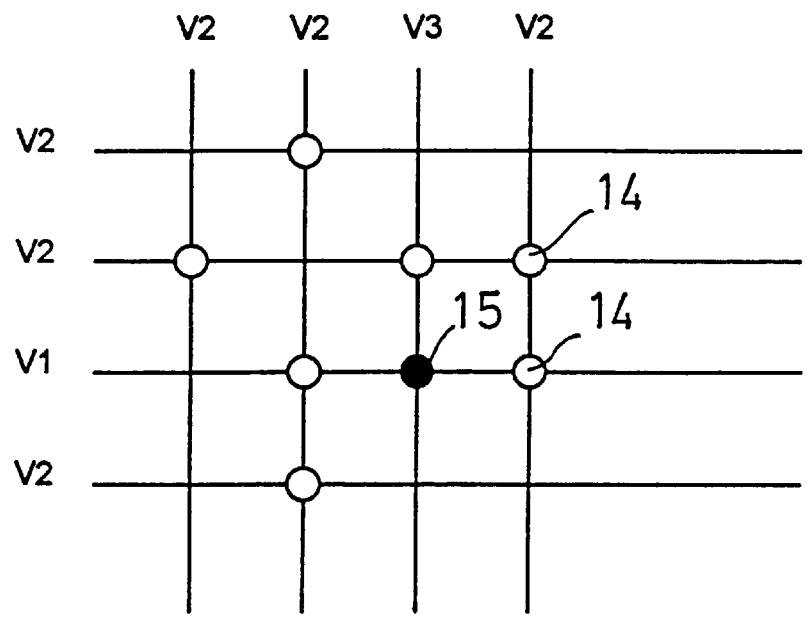
FIG. 3 is a schematic diagram of part of a cell plane.

Referring now to FIG. 3 there is shown a schematic of a cell plane. The vertical lines correspond to the conductor tracks of the conductor track plane 1, and the horizontal lines correspond to the conductor tracks of the conductor track plane 2. In the intersecting regions, circles 14 indicate that in the thus-identified intersecting regions, a VIA tunnel contact has been made that represents a logic "1". A missing VIA contact, which is represented by the absence of a circle at the intersection point, represents a logic "0". If a certain cell is then to be read out, this can be done by applying certain voltages to the respective conductor tracks. In the present example, the intersection point marked with the black circle 15 is to be read out. There is a VIA tunnel contact at this intersection point. A voltage V1 is applied to the horizontal conductor track belonging to the selected cell, while a voltage V3 is applied to the vertical conductor track belonging to the selected cell. To all the other conductor tracks, the voltage V2 is applied. This voltage is favorably 0 V. V1 is −2 V and is thus below V2, while V3 is +2 V and is thus above V2. The voltage V3−V1 therefore drops at the tunnel oxide 8 of the selected cell (marked by the black circle 15). The nonselected cells within the same horizontal conductor track receive the voltage V2−V1, while the nonselected cells within the same vertical conductor track receive the voltage V3−V2. All the other cells, in which the voltage V2 is applied to both the horizontal and the vertical conductor track, receive no voltage whatever. The thickness of the tunnel oxide and the electrical field above the tunnel oxide must both be selected such that a current flows only through the selected cell. In the present example, this means that the cutoff voltage must be between 2 and 4 V, since at the selected cell the voltage V3−V1, that is, 4 V is applied, while either the voltage V3−V2 or V2−V1, in each case 2 V, is applied to the other cells of the same conductor track.

Figure 4:
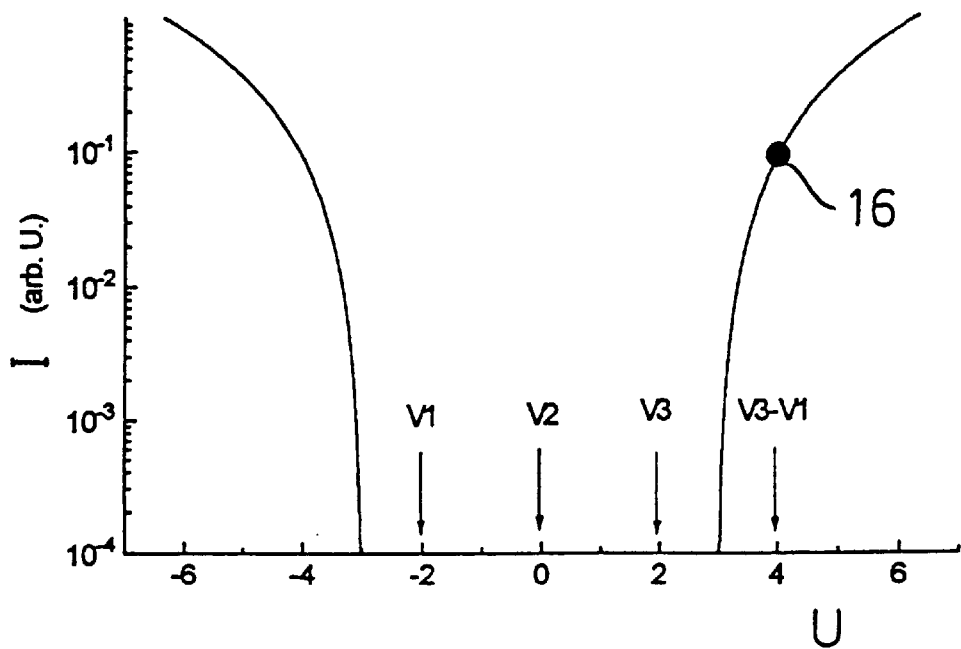
FIG. 4 is a graph of a characteristic reading curve.

In FIG. 4, a corresponding characteristic reading line is shown, in which the current (in arbitrary units) flowing through the cell is plotted over the voltage, in volts, across the tunnel contact. The reading current ensues at a threshold voltage of +3 V or −3 V, so that there is as yet no reading current at the voltages V2−V3 or V2−V1. However, if the voltage V3−V1 is applied to the selected cell, then the reading current 16, marked with the black dot, flows. Since the tunnel characteristic is very steep, work can be done using relatively low voltages. At typical readout times of 10 ns and a readout current of 50 $\mu$A, the readout operation can be done 2×10$^{12}$ times before a 1 coulomb charge has flowed through the contact. To keep the degradation of the tunnel oxide as slight as possible, care must be taken to assure a good quality of the tunnel oxide.

We claim:

1. A read only memory, comprising:

a multiplicity of conductor tracks respectively disposed in a plurality of conductor track planes including a first conductor track plane and at least one adjacent conductor track plane;

said conductor tracks of said first conductor track plane intersecting said conductor tracks of said at least one adjacent conductor track plane at intersecting regions; and electrical contacts formed at selected intersecting regions between said conductor tracks of said first conductor track plane and of said at least one adjacent conductor track plane for representing a given logic state at the selected intersecting regions.

2. The read only memory according to claim 1, wherein said conductor tracks are metal tracks.

3. The read only memory according to claim 2, wherein said conductor tracks comprise aluminum.

4. The read only memory according to claim 1, wherein said conductor tracks are polysilicon conductor tracks.

5. The read only memory according to claim 1, wherein said electrical contacts are VIA tunnel contacts.

6. The read only memory according to claim 5, wherein said VIA tunnel contacts include a tunnel oxide formed on a lower conductor track plane and a VIA plug on said tunnel oxide.

7. The read only memory according to claim 6, wherein said VIA plug comprises tungsten.

8. The read only memory according to claim 1, which comprises intermetal oxide disposed between said conductor tracks and said conductor track planes.

9. The read only memory according to claim 8, wherein said intermetal oxide is TEOS.

10. The read only memory according to claim 1, wherein said conductor tracks of adjacent conductor track planes intersect at an angle of 90°.

11. A method of operating a read only memory formed with a multiplicity of conductor tracks respectively disposed in a plurality of conductor track planes including a first conductor track plane and at least one adjacent conductor track plane, the conductor tracks of the first conductor track plane intersecting the conductor tracks of the adjacent conductor track plane at intersecting regions and defining memory cells, and electrical contacts formed at selected memory cells between said conductor tracks of said first conductor track plane and of said at least one adjacent conductor track plane for representing a given logic state in the selected memory cell, the method which comprises:

selecting a given memory cell of the read only memory;

applying a first voltage to one conductor track of the selected cell;

applying a second voltage to the other conductor track of the selected cell;

applying a third voltage to all remaining conductor tracks; and setting the first voltage lower than the third voltage, and the third voltage lower than the second voltage.

12. The method according to claim 11, wherein the third voltage is 0V.

13. The method according to claim 11, wherein the first voltage is −2V, and the second voltage is +2V.

* * * * *